(12) United States Patent
Ruppi

(10) Patent No.: US 7,993,742 B2
(45) Date of Patent: Aug. 9, 2011

(54) ALUMINA LAYER WITH ENHANCED TEXTURE

(75) Inventor: Sakari Ruppi, Fagersta (SE)

(73) Assignee: Seco Tools AB, Fagersta (SE)

( * ) Notice: Subject to any disclaimer, the term of this patent is extended or adjusted under 35 U.S.C. 154(b) by 985 days.

(21) Appl. No.: 11/527,711

(22) Filed: Sep. 27, 2006

(65) Prior Publication Data

US 2007/0104945 A1   May 10, 2007

(30) Foreign Application Priority Data

Sep. 27, 2005  (SE) ..................... 0502115

(51) Int. Cl.
*B32B 9/00* (2006.01)

(52) U.S. Cl. ............ 428/325; 51/307; 51/309; 428/216; 428/336; 428/698; 428/701; 428/702

(58) Field of Classification Search ............ 51/307, 51/309; 428/216, 325, 336, 469, 472, 697, 428/698, 699, 701, 702

See application file for complete search history.

(56) References Cited

U.S. PATENT DOCUMENTS

| | | | | |
|---|---|---|---|---|
| 5,851,687 A * | 12/1998 | Ljungberg | ............ | 428/702 |
| 6,333,098 B1 * | 12/2001 | Olsson et al. | ............ | 428/701 |
| 6,333,103 B1 * | 12/2001 | Ishii et al. | ............ | 428/325 |
| 6,733,874 B2 * | 5/2004 | Ueda et al. | ............ | 428/216 |
| 7,135,221 B2 * | 11/2006 | Ruppi et al. | ............ | 428/698 |
| 7,163,735 B2 * | 1/2007 | Ruppi | ............ | 428/336 |
| 7,201,956 B2 * | 4/2007 | Oshika et al. | ............ | 428/216 |
| 7,306,636 B2 * | 12/2007 | Ljungberg | ............ | 51/307 |
| 7,531,212 B2 * | 5/2009 | Kohara et al. | ............ | 427/255.31 |

FOREIGN PATENT DOCUMENTS

| | | | |
|---|---|---|---|
| JP | 2004-299021 | * | 10/2004 |
| JP | 2005-238437 | * | 9/2005 |
| JP | 2005-313242 | * | 10/2005 |

OTHER PUBLICATIONS

Osada et al "Wear mechanism of t5hermally transformed CVD Al2O3 layer" iner. Jour. of Reftr. Met. & Hard Matl 24 (2006) pp. 387-391.*
Larsson et al "Microstructural investigationn of as-deposited and heat-treated CVD Al2O3" Surface and Coatings Tech. 94-95 (1997) pp. 76-81.*

* cited by examiner

*Primary Examiner* — Archene Turner
(74) *Attorney, Agent, or Firm* — WRB-IP; David J Serbin

(57) ABSTRACT

The present invention relates to a coated cutting tool insert comprising a substrate and a coating to be used in metal machining. The hard and wear resistant coating exhibits an excellent adhesion to the substrate covering all functional parts thereof. The coating is composed of one or more refractory layers of which at least one layer is $\alpha$-$Al_2O_3$ showing a strong growth texture along <001>. The $\alpha$-$Al_2O_3$ layer has a thickness ranging from 1 to 20 μm and is composed of columnar grains with a length/width ratio of 2 to 15. The layer is characterized by a strong (006) diffraction peak, measured using XRD, and by low intensity of (012), (104), (113) (024) and (116) diffraction peaks. The <001> textured $\alpha$-$Al_2O_3$ layers is deposited in a temperature range of 750-1000° C. The texture is controlled by a specific nucleation procedure combined with the use of sulphur- and fluorine containing dopants.

17 Claims, 2 Drawing Sheets

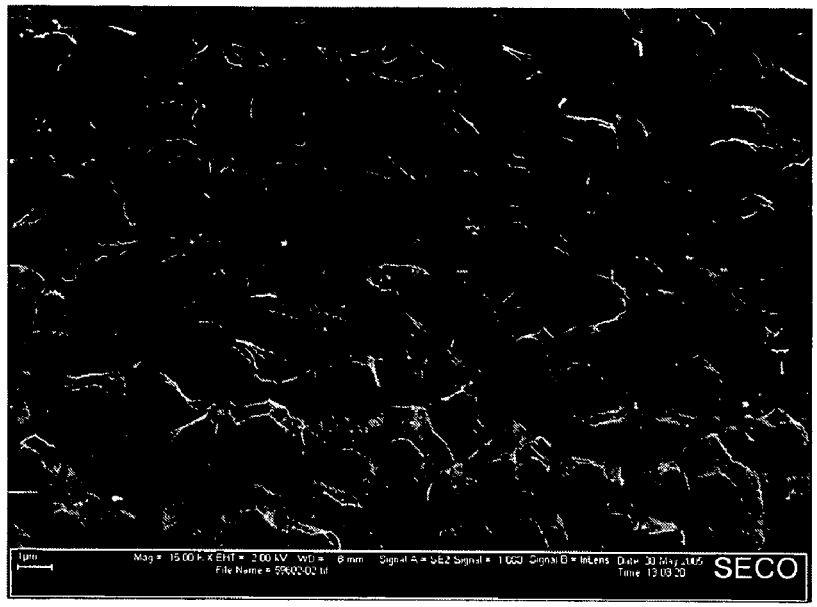
Fig 1a
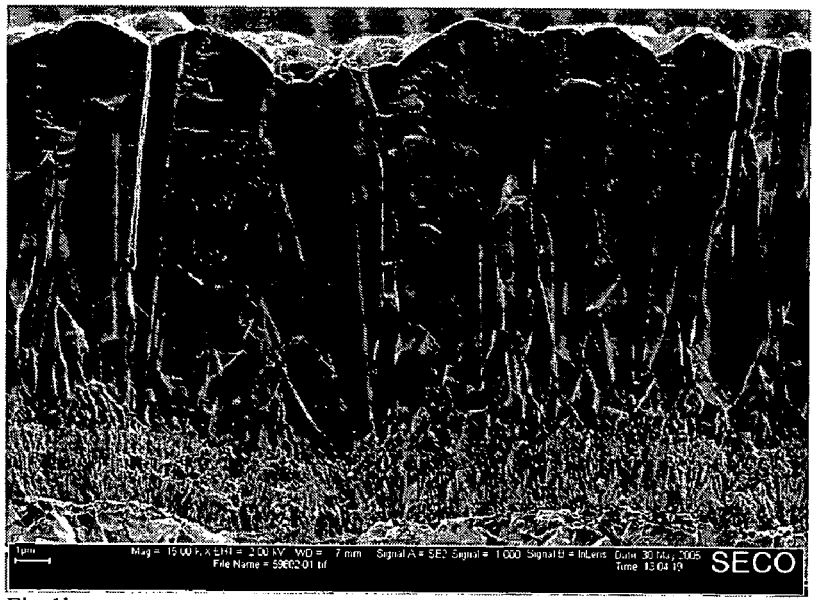
Fig 1b
Fig.1

ALUMINA LAYER WITH ENHANCED TEXTURE

CROSS-REFERENCE TO RELATED APPLICATION

This application claims priority from Swedish application No. SE 0502115-9 filed Sep. 27, 2005 which is hereby incorporated by reference in its entirety.

FIELD OF THE INVENTION

The present invention relates to a coated cutting tool insert designed to be used in metal machining. The coating exhibits an excellent adhesion to the substrate covering all functional parts thereof. The coating is composed of one or more refractory layers of which at least one is an $\alpha$-$Al_2O_3$ layer strongly textured in the <001> direction.

BACKGROUND OF THE INVENTION

Techniques to deposit $\alpha$-$Al_2O_3$ and $\kappa$-$Al_2O_3$ layers with nucleation control have been introduced on an industrial scale only recently, and it has clearly been shown that $\alpha$-$Al_2O_3$ is the preferred phase in most metal cutting applications.

According to the definition used in the International Tables of Crystallography, $\alpha$-$Al_2O_3$ belongs to the trigonal crystal system and has a rhombohedrally centred hexagonal lattice, the space group symbol being $R\bar{3}c$. The crystal structure of $\alpha$-$Al_2O_3$ is often described as being composed of oxygen ions (A, B) in an approximate hcp (hexagonal close-packed) arrangement ( . . . ABAB . . . ) with the aluminium anions occupying two thirds of the octahedral interstices. The aluminium cations can take three different vacancy positions in the oxygen lattice with the stacking sequence of . . . $\alpha\beta\gamma\alpha\beta\gamma$ . . . . These are usually referred to as $c^\alpha$, $c^\beta$ and $c^\gamma$. The unit cell of $\alpha$-$Al_2O_3$ comprises six layers of O and Al can be described in the following way: $Ac^\alpha Bc^\beta Ac^\gamma Bc^\alpha Ac^\beta Bc^\gamma$. The JPDS card, defined hereinbelow, uses the hexagonal system and, consequently, four axes (hkil) are used where $i=-(h+k)$. Often, the index i is omitted as done also in this case.

It has been known in the art to use nucleation control in order to obtain various growth textures. As described in a recent publication (S. Ruppi, "Deposition, microstructure and properties of texture-controlled CVD $\alpha$-$Al_2O_3$ coatings," Int. J. Refractory Metals & Hard Materials 23 (2005) pp. 306-315) manipulation of the nucleation surfaces can be used to obtain the growth textures <012>, <104> or <003>. The commonly observed diffraction peaks from $\alpha$-$Al_2O_3$ are (012), (104), (110), (113) and (116). However the diffraction peak (006), which is an indication of the <001> texture, is always missing, as indicated by its absence in XRD-patterns obtained from textured $\alpha$-$Al_2O_3$ layers using known methods.

Prior to the present invention, texture has been controlled by modifying the chemistry of the nucleation surface. This approach, however, does not provide complete nucleation control. When the nucleation control is not complete, at least a portion of the produced $\alpha$-$Al_2O_3$ layers are formed via $\kappa$-$Al_2O_3\alpha$-$Al_2O_3$ phase transformation. These kinds of $\alpha$-$Al_2O_3$ layers are composed of larger grains with transformation cracks. They exhibit much lower mechanical strength and ductility than textured $\alpha$-$Al_2O_3$ layers composed of $\alpha$-$Al_2O_3$ formed from 100% or near 100% nucleation. Consequently, there is a need to develop techniques to more precisely control the nucleation step and growth texture of $\alpha$-$Al_2O_3$.

The control of the $\alpha$-$Al_2O_3$ polymorph in industrial scale was achieved in the beginning of the 1990s with commercial products based on U.S. Pat. No. 5,137,774. Later modifications of this patent have been used to deposit $\alpha$-$Al_2O_3$ with preferred textures. In U.S. Pat. No. 5,654,035 an alumina layer textured in the <012> direction and in U.S. Pat. No. 5,980,988 in the <110> direction are disclosed. In U.S. Pat. No. 5,863,640 a preferred growth either along <012>, or <104> or <110> is disclosed. U.S. Pat. No. 6,333,103 describes a modified method to control the nucleation and growth of $\alpha$-$Al_2O_3$ along the <10(10)> direction. U.S. Pat. No. 6,869,668 describes a method to obtain a strong <300> texture in $\alpha$-$Al_2O_3$ using a texture modifying agent ($ZrCl_4$). The prior-art processes discussed above all use deposition temperatures of about 1000° C.

US 2004/0028951A1 describes a technique to achieve a pronounced <012> texture. The commercial success of this kind of product demonstrates the importance to refine the CVD process of $\alpha$-$Al_2O_3$ towards fully controlled textures.

OBJECTS AND SUMMARY OF THE INVENTION

It is an object of the present invention is to provide an alumina layer providing improved physical properties to a cutting tool insert.

It is another object of the invention to provide an alumina layer, as above, wherein the physical properties of the coated insert can be tailored through control of the nucleation and growth of an $\alpha$-$Al_2O_3$ phase in the coating.

These objects are achieved by a cutting tool insert comprising a substrate at least partially coated with a coating having a total thickness of from about 5 to about 40 µm, preferably 5-25 µm comprising one or more refractory layers of which at least one layer of which is an $\alpha$-alumina layer wherein said ax-alumina layer comprises columnar $\alpha$-$Al_2O_3$ grains with a <001> growth direction.

The objects of the invention are also achieved by a method of making an $\alpha$-$Al_2O_3$ layer on a substrate which comprises the steps of nucleating said alumina in a temperature range of from about 750 to about 1000° C., and controlling both the nucleation and growth of $\alpha$-alumina using sulphur-containing and at least one fluorine-containing precursor.

BRIEF DESCRIPTION OF THE DRAWINGS

For a fuller understanding of the invention, the following detailed description should be read in conjunction with the drawings, wherein:

FIG. 1a shows SEM-image of a typical surface morphology of the layer according to this invention in 15000×;

FIG. 1b shows the same layer in cross-section in 15000×; and

DETAILED DESCRIPTION OF THE INVENTION

Figure 2:
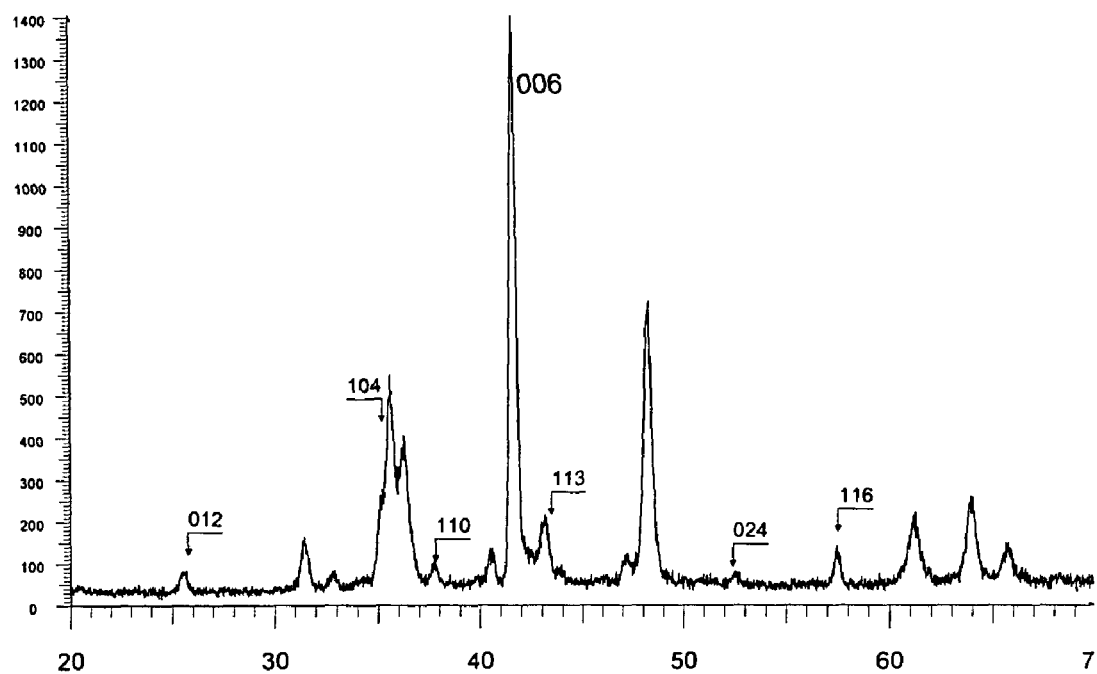
FIG. 2 shows an XRD pattern of an $\alpha$-$Al_2O_3$-layer according to this invention for $2\theta$=20-70°.

According to the present invention there is provided a coated cutting tool insert comprising a substrate and a coating to be used in metal machining. It has been surprisingly found that a <001> texture can be deposited in a controlled way. It is characterised in the XRD pattern by a strong (006) peak. The alumina layer with strong <001> texture outperforms prior art coatings with random or other controlled textures. Further, increased toughness can be obtained.

The substrate comprises a hard material such as cemented carbide, cermets, ceramics, high speed steel or a superhard material such as cubic boron nitride (CBN) or diamond preferably cemented carbide or CBN. With CBN is herein meant a cutting tool material containing at least 40 vol-% CBN. In a preferred embodiment the substrate is a cemented carbide with a binder phase enriched surface zone.

It has been experimentally confirmed that $\alpha$-$Al_2O_3$ can be nucleated, for example, on $Ti_2O_3$ surfaces, bonding layers of (Ti,Al)(C,O) or by controlling the oxidation potential using $CO/CO_2$ mixtures. The idea in all these approaches is that nucleation must not take place on the surfaces of TiC, TiN, Ti(C,N) or Ti(C,O,N) with fcc (face centered cubic) or in general on phases with cubic structure, otherwise $\kappa$-$Al_2O_3$ is obtained.

Further, it has been noticed that enhanced performance can be obtained through optimising the texture of $\alpha$-$Al_2O_3$. It is thus possible to enhance tool performance by tailoring the $\alpha$-$Al_2O_3$ texture for different metal cutting applications and work piece materials.

The hard and wear resistant coating exhibits an excellent adhesion to the substrate covering all functional parts thereof. It is composed of one or more refractory layers of which at least one layer is a strongly textured $\alpha$-$Al_2O_3$ deposited on a bonding layer of (Ti,Al)(C,O,N) with increasing aluminium content towards the outer surface. The $\alpha$-$Al_2O_3$ layer is 1-45 μm composed of columnar grains with a strong <001> texture. The length/width ratio of the alumina grains is from 2 to 15, preferably >5. The layer is characterised by a strong (006) diffraction peak, measured using XRD, and by low intensity of (012), (104), (113), (024) and (116) diffraction peaks.

The texture coefficients (TC) for the $\alpha$-$Al_2O_3$-layer is determined as follows:

$$TC(hkl) = \frac{I(hkil)}{I_0(hkil)}\left\{\frac{1}{n}\sum\frac{I(hkil)}{I_0(hkil)}\right\}^{-1}$$

where
I(hkl)=intensity of the (hid) reflection
$I_O$(hkl)=standard intensity according to JCPDS card no 46-1212
n=number of reflections used in the calculation The (hkl) reflections used are: (012), (104), (110), (600), (113) and (116). The (024) reflection, which is the second-order reflection of (012), is omitted from the calculations.

The texture of the alumina layer is defined as follows:
TC(006) >1.4, preferably >3.0 and most preferably >4.0. This is a manifestation of a strong <001> texture. The texture coefficients for (012), (104), (113), (024) and (116) diffraction peaks are less than 0.5, preferably less than 0.2 and most preferably less than 0.1.

More particularly, the coating comprises a first layer adjacent the substrate of CVD Ti(C,N), CVD TiN, CVD TiC, MTCVD Ti(C,N), MTCVD Zr(C,N), MTCVD Ti(B,C,N), CVD HfN or combinations thereof preferably of Ti(C,N) having a thickness of from 1 to 20 μm, preferably from 1 to 10 μm. Preferably there is an intermediate layer of TiN between the substrate and said first layer with a thickness of <3 μm, preferably 0.5-2 μm.

In one embodiment the $\alpha$-$Al_2O_3$ layer is the uppermost layer. In another embodiment there is a layer of carbide, nitride, carbonitride or carboxynitride of one or more of Ti, Zr and Hf, having a thickness of from about 0.5 to 3 μm, preferably 0.5 to 1.5 μm atop the $\alpha$-$Al_2O_3$ layer. Alternatively this layer has a thickness of from about 1 to 20 μm, preferably 2 to 8 μm.

In yet another embodiment the coating includes a layer of $\kappa$-$Al_2O_3$ and/or $\gamma$-$Al_2O_3$ preferably atop the $\alpha$-$Al_2O_3$ with a thickness of from 0.5 to 10, preferably from 1 to 5 μm.

The present invention also relates to a refined method to produce textured $\alpha$-$Al_2O_3$ layers in a temperature range of 950-1000° C., preferably at 1000° C. with a controlled <001> texture. The $\alpha$-$Al_2O_3$ layer is deposited on a bonding layer of (Ti,Al)(C,O,N) with increasing aluminium content towards the outer surface. On to this layer a Ti(C,O) layer is deposited with controlled O-content. A very thin titanium oxide nucleation layer is obtained in the similar way as used in ALD (Atomic Layer Deposition). The procedure is as follows: (i) exposure of a first precursor $TiCl_4$, preferably together with $AlCl_3$, (ii) purge ($N_2$), (iii) exposure of the second precursor ($H_2O$), (iv) purge ($N_2$). The duration of the steps (i) and (iii) is 1-5 min, preferably 2 min each and the steps (ii) and (iv) 2-10 min, preferably 5 min each. The deposition of the $\alpha$-$Al_2O_3$ is started with a relatively long 30-120 min, preferably 60 min, nucleation step without sulphur- or fluorine containing compounds. $\alpha$-$Al_2O_3$ is grown to its desired thickness using sulphur-containing compounds $H_2S$, or $SO_2$, preferably $H_2S$, optionally together with fluorine-containing compounds $SF_6$ or HF, preferably $SF_6$.

It has been found, quite unexpectedly, that <001> texture could be obtained by careful control of the ratio of sulphur containing dopants to $CO_2/CO$. When $\alpha$-$Al_2O_3$ is nucleated correctly, followed by a deposition process using relatively low amounts of these dopants (0.5-1.2%) together with a $CO+CO_2$ gas mixture where $CO=0.5$-$2\times CO_2$, a strong <001> growth texture can be obtained in a controlled way. The correct ratios depend on the type of deposition equipment, flow rate etc. An important difference compared with the prior-art is that the texture is controlled, in addition to the nucleation procedure, also during the growth of $\alpha$-$Al_2O_3$ itself. The described texture is thereby obtained when both the nucleation and growth are controlled correctly. The lack of control of both nucleation and growth is a possible explanation for the fact that the <001> texture [(006) diffraction peak)] has heretofore been unknown.

The following is a detailed description of a preferred sequence of nucleation steps.

1. Depositing a bonding layer 0.1-1 μm thick in a gas mixture of 2-3% $TiCl_4$ and $AlCl_3$ increasing from 0.5 to 6%, 3-10% CO, 1-3% $CO_2$, 0.2-1.0% $CH_3CN$, 0.2-1.0%, 2-10% $N_2$ and balance $H_2$ at about 750-1000° C., preferably at 800° C. and at a pressure of 50-200 mbar.
2. Purging by $N_2$ for 5 min.
3. Treating the bonding layer in a gas mixture of 5-15% $TiCl_4$ and 5-20% CO, 0.5-3% $CO_2$ and 10-20% Ar in hydrogen for 5-15, preferably 10, minutes min at 950-1000° C., preferably at 1000° C. and at a pressure of 50-200 mbar.
4. Purging by $N_2$ for 5 min.
5. Treating the bonding layer in a gas mixture of 8-15% $TiCl_4$ and 0.5-2% $AlCl_3$ in hydrogen for 5-15 min at about 950 to about 1000° C., preferably at about 1000° C. and at a pressure of from about 50 to about 200 mbar.
6. Treating in a gas mixture of 0.05 to 0.5% $H_2O$, preferably 0.01%, balance $H_2$.
7. Purging by $N_2$ for 5 min.
8. Nucleation of the alumina layer at a temperature of 950-1000° C. with desired thickness according to known technique or depositing an alumina layer at 950-1000° C. without any catalysing precursors.

9. Deposition of the alumina layer at a temperature of 950-1000° C. to the desired thickness at 950-1000° C. at deposition pressures 50-200 mbar using 0.01-0.05% $H_2S$ or $SO_2$, preferably $H_2S$ and 0.01-0.02% $SF_6$ or HF, preferably $SF_6$ as catalysing agents. $CO_2$ 1.0-4.5% is used as the oxygen donor together with CO, maintaining $CO=2\times CO_2$.

Example 1

Cemented carbide cutting inserts with a composition of 5.9% Co and balance WC (hardness about 1600 HV) were coated with a layer of MTCVD Ti(C,N). The thickness of the MTCVD layer was about 2 μm. On to this layer an $\alpha$-$Al_2O_3$ layer consisting of about 10 μm. $\alpha$-$Al_2O_3$ was deposited according to this invention referred to as Coating a). The detailed process data is given below:

| Step 1: Bonding layer 1 | |
| --- | --- |
| Gas mixture | $TiCl_4$ = 2.8% |
| | $CH_3CN$ = 0.7% |
| | $AlCl_3$ = increasing from 0.8 to 5.4% |
| | CO = 8.8% |
| | $CO_2$ = 2.2% |
| | $N_2$ = 5% |
| | Balance: $H_2$ |
| Duration | 40 min |
| Temperature | 1000° C. |
| Pressure | 100 mbar |
| Step 2: $N_2$ purge | |
| Step 3: Bonding layer 2 | |
| Gas mixture | $TiCl_4$ = 8% |
| | CO = 12% |
| | $CO_2$ = 1.2% |
| | Ar = 5% |
| | Balance: $H_2$ |
| Duration | 2–10 min |
| Temperature | 1000° C. |
| Pressure | 100 mbar |
| Step 3: (optional ALD steps): a)$TiCl_4$ treatment b) $N_2$-purge c) $H_2O$ treatment d) $N_2$-purge | |
| a) | $TiCl_4$ = 9% |
| | $AlCl_3$ = 1% |
| | $H_2$ = balance |
| | 5 min |
| c) | $H_2O$ = 0.1% |
| | $H_2$ = balance |
| | 2 Min |
| b, d) | $N_2$ = 100% |
| | 5 min |
| Temperature | 1000° C. |
| Pressure | 50 mbar |
| Step 4: Nucleation step | |
| Gas mixture | $AlCl_3$ = 1.2% |
| | HCl = 2.0% |
| | $CO_2$ = 1.0–1.5% |
| | CO = 0.5–2.4% |
| | Balance $H_2$ |
| Duration | 60 min |
| Temperature | 1000° C. |
| Pressure | 50 mbar |
| Step 5: Deposition | |
| Gas mixture | $AlCl_3$ = 2.8% |
| | HCl = 3% |
| | $CO_2$ = 1.8–2.5% |
| | CO = 0.9–.5% |
| | $H_2S$ = 0.05–1.0% |
| | Balance: $H_2$ |
| Duration | 630 min |
| Temperature | 1000° C. |
| Pressure | 70 mbar |

Example 2

Coating a) was studied using X-ray diffraction. The texture coefficients of the $\alpha$-$Al_2O_3$ layers were determined and are presented in Table 1. A SEM micrograph of Coating a) in top view with <001> texture is shown in FIG. 1a and in cross section in FIG. 1b. The $\alpha$-$Al_2O_3$ layer was composed of columnar grains. The X-Ray diffraction pattern is shown in FIG. 2.

TABLE 1

| hkl | Coating a) |
| --- | --- |
| 012 | 0.01 |
| 104 | 0.06 |
| 110 | 0.01 |
| 006 | 5.91 |
| 113 | 0.00 |
| 116 | 0.02 |

Example 3

For reference Coatings b) and c) with <012> and <104> textures were deposited according to the prior-art (coating thickness about 10 μm). The coatings were studied using X-ray diffraction. The texture coefficients of the $\alpha$-$Al_2O_3$ layers were determined and are presented in Table 2.

TABLE 2

| hkl | Coating a), invention | Coating b) | Coating c) |
| --- | --- | --- | --- |
| 012 | 0.03 | 5.15 | 0.16 |
| 104 | 0.06 | 0.13 | 4.27 |
| 110 | 0.01 | 0.10 | 0.08 |
| 600 | 5.88 | 0.00 | 0.09 |
| 113 | 0.00 | 0.18 | 0.66 |
| 116 | 0.02 | 0.44 | 0.74 |

Example 4

Coating a), b) and c) deposited on Co-enriched substrates were tested with respect to toughness in longitudinal turning with interrupted cuts.

Work piece: Cylindrical slotted bar
Material: SS1672
Insert type: CNMG120408-M3
Cutting speed: 140 m/min
Feed: 0.1, 0.125, 0.16, 0.20, 0.25, 0.315, 0.4, 0.5, 0.63, 0.8 mm/rev gradually increased after 10 mm length of cut
Depth of cut: 2.5 mm
Remarks: dry turning Tool life criteria: Gradually increased feed until edge breakage. 10 edges of each variant were tested.

The inserts were inspected after 2 and 4 minutes of cutting. As clear from Table 3 the edge toughness was considerably enhanced when the layer was produced according to this invention.

TABLE 3

| Experimental coating | Mean feed at breakage (mm/rev) |
| --- | --- |
| Coating a (006), according to the invention | 0.50 |
| Coating b (012) | 0.22 |
| Coating c (104) | 0.36 |

The test results show (Table 3) that the coating according to the invention (Coating a) exhibited clearly better toughness behaviour than the prior-art (Coatings b and c).

Example 5

The coatings a), b) and c) were tested with respect to edge chipping in longitudinal turning in cast iron.

Work piece: Cylindrical bar
Material: SS0130
Insert type: SNUN
Cutting speed: 400 m/min
Feed: 0.4 mm/rev
Depth of cut: 2.0 mm
Remarks: dry turning The inserts were inspected after 2 and 4 minutes of cutting. As clear from Table 4 the edge toughness of the prior art product was considerably enhanced when the coating was produced according to this invention.

TABLE 4

| | Flaking of the edge line (%) after 2 minutes | Flaking of the edge line (%) after 6 minutes |
| --- | --- | --- |
| Coating a (Invention) | 0 | 5 |
| Coating b | 0 | 18 |
| Coating c | 5 | 10 |

Example 6

Cubic boron nitride (CBN) insert containing about 90% of polycrystalline CBN (PCBN) were coated according to this invention and according to prior art Coating b). The coated CBN was compared with uncoated CBN insert in cutting of steel containing ferrite. It is known that B has a high affinity to ferrite and diffusion wear occurs at high cutting speeds.

Work piece: Cylindrical bar
Material: SS0130
Insert type: SNUN
Cutting speed: 800 m/min
Feed: 0.4 mm/rev
Depth of cut: 2.5 mm
Remarks: dry turning

TABLE 5

| | Life time (min) |
| --- | --- |
| Coated CBN, Invention | 23 |
| Coated CBN, prior art, 012 texture | 14 |
| Uncoated CBN | 9 |

As is evident from Table 5 the coating according to this invention is superior to the prior art.

Example 7

The hardness and Young's modulus of the coatings a)-c) together with $\kappa$-$Al_2O_3$ and older prior-art $\alpha$-$Al_2O_3$ were measured using nanoindentation. The results are shown in Table 6.

TABLE 6

| | Hardness (GPa) | Young's Modulus (GPa) |
| --- | --- | --- |
| Coating a | 28.92 | 444.42 |
| Coating b | 27.31 | 419.53 |
| Coating c | 28.81 | 441.17 |
| Prior-art $\alpha$-$Al_2O_3$ (no texture) | 25.79 | 385.45 |
| $\kappa$-$Al_2O_3$ | 23.64 | 339.51 |

Coating c) according to the invention shows the highest values of hardness and modulus, closely followed by coating c).

What is claimed is:

1. A cutting tool insert comprising a substrate at least partially coated with a coating having a total thickness of from about 5 to about 40 µm, comprising one or more refractory layers of which at least one layer of which is an $\acute{\alpha}$-alumina layer wherein said $\acute{\alpha}$-alumina layer comprises nucleated columnar $\acute{\alpha}$-$Al_2O_3$ grains with a <001> growth direction with texture coefficients a) TC(006)>1.4, the texture coefficient TC(hkl) being defined as $$TC(hkl) = \frac{I(hkil)}{I_0(hkil)} \left\{ \frac{1}{n} \sum \frac{I(hkil)}{I_0(hkil)} \right\}^{-1}$$

wherein
I(hkl)=measured intensity of the (hkl) reflection
$I_0$(hkl)=standard intensity according to JCPDS card no 46-1212
n=number of reflections used in the calculation
(hkl) reflections used are: (012), (104), (110), (006), (113) and (116).

2. Cutting tool insert according to claim 1, wherein said at least one layer is an as deposited layer of $\acute{\alpha}$-alumina.

3. Cutting tool insert according to claim 1, wherein said alumina columnar grains have a length/width ratio from about 2 to about 15.

4. Cutting tool insert according to claim 1, wherein said substrate comprises cemented carbide with a binder phase enriched surface zone, CBN or sintered CBN alloy.

5. Cutting tool insert according to claim 1, wherein the coating comprises a first layer adjacent the body of CVD Ti(C,N), CVD TiN, CVD TiC, MTCVD Ti(C,N), MTCVD Zr(C,N), MTCVD Ti(B,C,N), CVD HfN or combinations thereof, and said $\acute{\alpha}$-$Al_2O_3$ layer adjacent said first layer having a thickness of from about 1 to about 40 µm.

6. Cutting tool insert according to claim 1, wherein the $\acute{\alpha}$-$Al_2O_3$ layer is the uppermost layer.

7. Cutting tool insert according to claim 1, wherein a layer of carbide, nitride, carbonitride or carboxynitride of one or more of Ti, Zr and Hf, having a thickness of from about 0.5 to 3 µm atop the $\acute{\alpha}$-$Al_2O_3$ layer.

8. Cutting tool insert according to claim 1, wherein a layer of carbide, nitride, carbonitride or carboxynitride of one or more of Ti, Zr and Hf, having a thickness of from about 1 to 20 μm atop the α-Al₂O₃ layer.

9. Cutting tool insert according to claim 1, wherein a layer of κ-Al₂O₃ or γ-Al₂O₃ atop the α-Al₂O₃ with a thickness of from 0.5 to 10 μm.

10. Cutting tool insert according to claim 1, wherein a layer of TiN between the substrate and said first layer with a thickness of <3 μm.

11. Cutting tool insert according to claim 1, wherein said coating has a total thickness of from about 5 to about 25 μm.

12. Cutting tool insert according to claim 1, wherein said alumina columnar grains have a length/width ratio from about 5 to about 10.

13. Cutting tool insert according to claim 1, wherein a first layer adjacent the body has a thickness of from 1 to 10 μm.

14. Cutting tool insert according to claim 1, wherein a α-Al₂O₃ layer adjacent a first layer has a thickness of from about 1 to about 20 μm.

15. Cutting tool insert according to claim 1, wherein a α-Al₂O₃ layer adjacent a first layer has a thickness of from about 1 to about 10 μm.

16. A cutting tool insert comprising a substrate at least partially coated with a coating having a total thickness of from about 5 to about 40 μm comprising one or more refractory layers of which at least one layer of which is an α-alumina layer wherein said α-alumina layer comprises nucleated columnar α-Al₂O₃ grains with a <001> growth direction with texture coefficients a) TC(006)>1.4, the texture coefficient TC(hkl) being defined as $$TC(hkl) = \frac{I(hkil)}{I_0(hkil)} \left\{ \frac{1}{n} \sum \frac{I(hkil)}{I_0(hkil)} \right\}^{-1}$$

wherein
I(hkl)=measured intensity of the (hkl) reflection
I₀(hkl)=standard intensity according to JCPDS card no 46-1212
n=number of reflections used in the calculation
(hkl) reflections used are: (012), (104), (110), (006), (113) and (116), and
wherein said α-alumina layer is formed by controlling both the nucleation and growth of α-alumina using sulphur-containing and at least one fluorine-containing precursor.

17. Cutting tool insert according to claim 16, wherein said at least one sulphur-containing precursor is selected from the group consisting of H₂S, SF₆, SO₂, SF₆ and mixtures thereof.

* * * * *